United States Patent
Cheng et al.

(10) Patent No.: US 11,281,278 B2
(45) Date of Patent: Mar. 22, 2022

(54) BATTERY BACKUP SYSTEM AND VOLTAGE DETECTION AND CONTROL CIRCUIT THEREOF

(71) Applicants: LITE-ON ELECTRONICS (GUANGZHOU) LIMITED, Guangzhou (CN); LITE-ON TECHNOLOGY CORPORATION, Taipei (TW)

(72) Inventors: Ming-Wang Cheng, Taipei (TW); Yi-Pin Lee, Taipei (TW); Ching Hsieh, Taipei (TW)

(73) Assignees: LITE-ON ELECTRONICS (GUANGZHOU) LIMITED; LITE-ON TECHNOLOGY CORPORATION

( * ) Notice: Subject to any disclaimer, the term of this patent is extended or adjusted under 35 U.S.C. 154(b) by 31 days.

(21) Appl. No.: 17/088,419

(22) Filed: Nov. 3, 2020

(65) Prior Publication Data
US 2022/0004241 A1    Jan. 6, 2022

(30) Foreign Application Priority Data
Jul. 1, 2020    (CN) .......................... 202010619584.6

(51) Int. Cl.
*G06F 1/30*    (2006.01)
*H02J 7/00*    (2006.01)
(Continued)

(52) U.S. Cl.
CPC ............ *G06F 1/305* (2013.01); *H02J 7/0063* (2013.01); *H02J 9/061* (2013.01); *H03K 17/223* (2013.01)

(58) Field of Classification Search
None
See application file for complete search history.

(56) References Cited

U.S. PATENT DOCUMENTS

| | | | |
|---|---|---|---|
| 2015/0021989 A1* | 1/2015 | Lin | H02J 9/061 307/23 |
| 2016/0164310 A1* | 6/2016 | Juntunen | H02J 7/345 320/134 |
| 2019/0074713 A1* | 3/2019 | Chou | H02J 9/061 |

FOREIGN PATENT DOCUMENTS

GN    103457339 A    12/2013

OTHER PUBLICATIONS

Communication corresponding to Taiwan Application No. 109122200 and issued by Taiwan Intellectual Property Office dated Jan. 7, 2021, 6 pages.

* cited by examiner

*Primary Examiner* — Daniel C Puentes
(74) *Attorney, Agent, or Firm* — Innovation Counsel LLP (57) ABSTRACT

A battery backup system includes a battery pack, a charger, a discharger, a voltage detection and control circuit, a first protection switch, a second protection switch and a third protection switch. The battery pack provides a backup power to a DC bus. The charger, connected to the battery pack, receives an external power. The discharger has an input end and an output end. The voltage detection and control circuit detects whether the voltage of the DC bus is greater than first or second voltage drop point. The first, the second and the third protection switches respectively are connected between the battery pack and the input end, between the DC bus and the output end, and between the charger and the input end. The first protection switch is turned on/off according to whether the voltage of the DC bus is less than or greater than the first voltage drop point.

11 Claims, 6 Drawing Sheets

(51) Int. Cl.
  *H02J 9/06* (2006.01)
  *H03K 17/22* (2006.01)

BATTERY BACKUP SYSTEM AND VOLTAGE DETECTION AND CONTROL CIRCUIT THEREOF

This application claims the benefit of People's Republic of China application Serial No. 202010619584.6, filed Jul. 1, 2020, the subject matter of which is incorporated herein by reference.

BACKGROUND OF THE INVENTION

Field of the Invention

The invention relates in general to a battery backup system, and more particularly to a battery backup system and a voltage detection and control circuit thereof.

Description of the Related Art

A data center or a service station normally uses a large number of servers to process the requirements of various application services. Since each server consumes a certain amount of power in the processing of various operations, the data center normally is equipped with a backup power to maintain normal operation during the interruption of AC power. If the backup power can quickly provide power to the load during the interruption of AC power, the data center can avoid the DC bus having a large voltage drop and causing a sudden shutdown. However, how to resolve the false action of the battery backup system and extend the lifespan of the battery pack still remains a challenge to the industries.

SUMMARY OF THE INVENTION

The invention is directed to a battery backup system and a voltage detection and control circuit thereof configured to detect the voltage state of the DC bus to assure the normal operation of the load on the DC bus and avoid the false action of the battery pack.

According to one embodiment of the present invention, a battery backup system including a battery pack, a charger, a discharger, a voltage detection and control circuit, a first protection switch, a second protection switch and a third protection switch is provided. The battery pack is configured to provide a backup power to a DC bus. The charger is connected to the battery pack to receive an external power. The discharger has an input end and an output end, the input end is connected to the battery pack and the charger, and the output end is connected to the DC bus. The voltage detection and control circuit is configured to detect whether the voltage of the DC bus is greater than a first voltage drop point or a second voltage drop point. The first protection switch is connected between the battery pack and the input end of the discharger; the second protection switch is connected between the DC bus and the output end of the discharger; the third protection switch is connected between the charger and the input end of the discharger. When the voltage of the DC bus is greater than the first voltage drop point, the first protection switch is turned off; when the voltage of the DC bus is less than or equal to the first voltage drop point, the first protection switch is turned on.

The above and other aspects of the invention will become better understood with regard to the following detailed description of the preferred but non-limiting embodiment(s). The following description is made with reference to the accompanying drawings.

DETAILED DESCRIPTION OF THE INVENTION

Referring to FIG. 1 to FIG. 5, schematic diagrams respectively illustrating a battery backup system 100 in a standby mode, a battery turned on mode, a discharge mode and a charge mode in part (a) and the voltage of the DC bus corresponding to each of the above modes in part (b) according to an embodiment of the present invention are shown.

Refer to FIG. 1 to FIG. 5. The battery backup system 100 includes a battery pack 110, a charger 120, a discharger 130, a voltage detection and control circuit 140, a first protection switch 112, a second protection switch 122 and a third protection switch 132. In the present embodiment, the external power 102, such as an AC power, is connected to a DC bus 106 via a power supplier 104 to provide sufficient DC power, such as 48V, to the load on the DC bus 106. Once the external power 102 is interrupted, the battery backup system 100, during the interruption period of the external power 102, provides a backup power to the DC bus 106 to assure the normal operation of the load on the DC bus 106. Here, the DC power is exemplified by 48V, but the present invention is not limited thereto. In other embodiments, the voltage of DC power can be 12V, 24V, 36V, 50V or others that fits actual needs.

In an embodiment, the battery pack 110, which can be formed by rechargeable batteries connected in parrel and/or series, provides a backup power to the DC bus 106. After the external power 102 resumes power supply and the power supplier 104 outputs power normally, the voltage of the DC bus 106 resumes normal, and the battery pack 110 does not need to provide power to the DC bus 106.

Besides, the charger 120 is connected to the battery pack 110 via the first protection switch 112 and the third protection switch 132. Also, the charger 120 can receive the external power 102 via the DC bus 106 to enter an activation mode and provide power to the battery pack 110 and/or the discharger 130. Once the external power 102 is interrupted, the charger 120 is turned off and does not provide power to the battery pack 110 and/or the discharger 130.

Moreover, the discharger 130 has an input end 130a and an output end 130b. The input end 130a is connected to the battery pack 110 and the charger 120 via the first protection switch 112 and the third protection switch 132, respectively. The output end 130b is connected to the DC bus 106 via the second protection switch 122. Once the external power 102 is interrupted, the charger 120 is turned off, the battery pack 110 provides power to the discharger 130, and the discharger 130 discharges the DC bus 106 until the external power 102 resumes power supply and the power supplier 104 resumes normal output or until the capacity of the battery pack 110 runs out.

Also, the first protection switch 112 is connected between the battery pack 110 and the input end 130a of the discharger 130; the second protection switch 122 is connected between the DC bus 106 and the output end 130b of the discharger 130; the third protection switch 132 is connected between the charger 120 and the input end 130a of the discharger 130. The voltage detection and control circuit 140 is configured to detect the voltage state of the DC bus 106 to determine whether to turn on or turn off (terminate) the first protection switch 112, the second protection switch 122 and the third protection switch 132.

The first protection switch 112 can be an electronic fuse or a transistor switching element configured to protect the battery pack 110. At the normal power supply mode (power saving mode), the first protection switch 112 is turned off, such that the battery pack 110 does not need to supply power to the discharger 130 which would otherwise consume the capacity of the battery pack 110. Furthermore, the battery pack 110 will be protected when the discharger 130 breaks down.

The second protection switch 122 can be an O-ring field effect transistor possessing the features of high accuracy, fast speed and low voltage error (such as less than 10 mv). The third protection switch 132 can be a transistor switching element.

Figure 6:
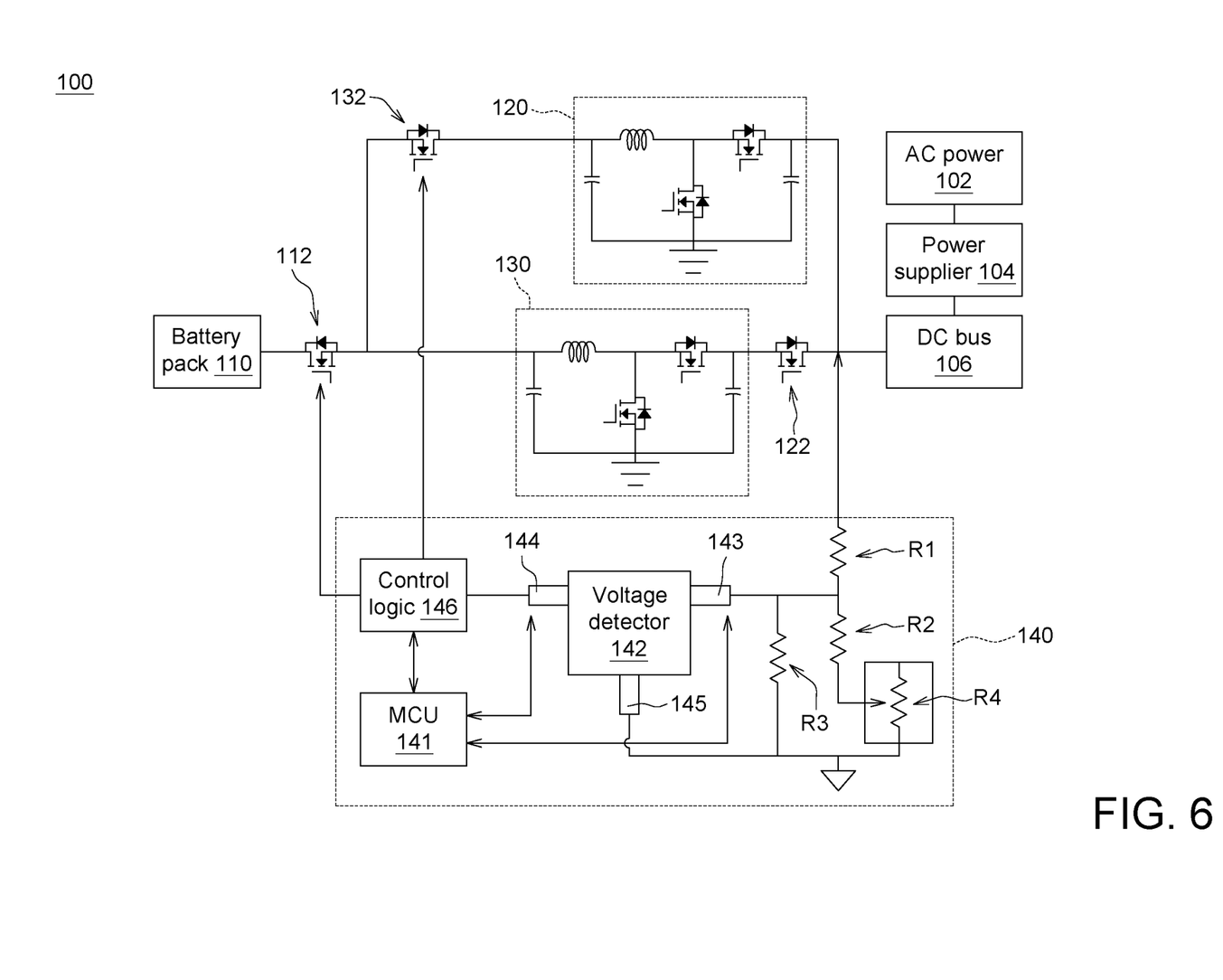
FIG. 6 is a circuit diagram of a battery backup system according to an embodiment of the present invention.

Additionally, the voltage detection and control circuit 140 is configured to detect whether the voltage of the voltage of the DC bus 106 is less than a voltage drop point. Referring to FIG. 6, a circuit diagram of a battery backup system 100 according to an embodiment of the present invention is shown. The voltage detection and control circuit 140 includes a micro-processor 141, a voltage detector 142 and a control logic 146. The voltage detector 142 has a sensing end 143, an output end 144 and a ground end 145, wherein the sensing end 143 is electrically connected to the DC bus 106; the output end 144 is electrically connected to the micro-processor 141 and the control logic 146; the ground end 145 is connected to the ground.

In an embodiment, a voltage divider circuit is formed by several resistors R1-R4 and is electrically connected to the voltage detector 142 and the DC bus 106. Here, the resistor R4 can be a digital potentiometer to reduce the voltage error range (such as ±0.027V) of the voltage detection and control circuit 140. In the present embodiment, the voltage divider circuit formed by the resistors R1-R4 measures and transmits the voltage of the DC bus 106 to the sensing end 143 of the voltage detector 142; the voltage detector 142 performs determination and processing according to the received voltage and outputs at least one voltage level to the control logic 146 via the output end 144 to turn on or turn off the first protection switch 112 and the third protection switch 132. That is, the voltage detector 142 can control the first protection switch 112 and the third protection switch 132 according to the voltage state of the DC bus 106 in a real-time manner. Here, the voltage detector 142 can be realized by an integrated circuit (IC).

In the present embodiment, on one hand, the micro-processor 141, can confirm the voltage state of the DC bus 106 and output a corresponding control signal to the control logic 146 according to the voltage state of the DC bus 106 to turn on or turn off the first protection switch 112 and the third protection switch 132; on the other hand, the micro-processor 141 can receive a signal or a parameter from the voltage detector 142 via the output end 144 and determine, according to the received signal or parameter, whether the voltage detector 142 operates normally. The micro-processor 141 will emit a warning signal if the operation of the voltage detector 142 is determined as abnormal. That is, in the present embodiment, the voltage detector 142 and the micro-processor 141 independently determine the voltage state of the DC bus 106 and further make corresponding control operation.

In the present embodiment, to assure a stable voltage output of the DC bus 106, the voltage detection and control circuit 140 detects whether the voltage of the DC bus 106 is greater than a first voltage drop point or a second voltage drop point. The first voltage drop point is 95% of the voltage of the DC bus 106 measured when the external power 102 supplies power normally. The second voltage drop point is lower than the first voltage drop point. For example, the second voltage drop point is lower than the first voltage drop point by such as 0.2V~0.3V, but the invention is not limited thereto. In an embodiment, the first voltage drop point is the maximum power voltage point that the power supplier 104 can provide when the load on the DC bus 106 requires a maximum power. The second voltage drop point is the voltage point which maintains the voltage of the DC bus 106 to be closest to the first voltage drop point to avoid the false action of the battery backup system 100.

Figure 1:
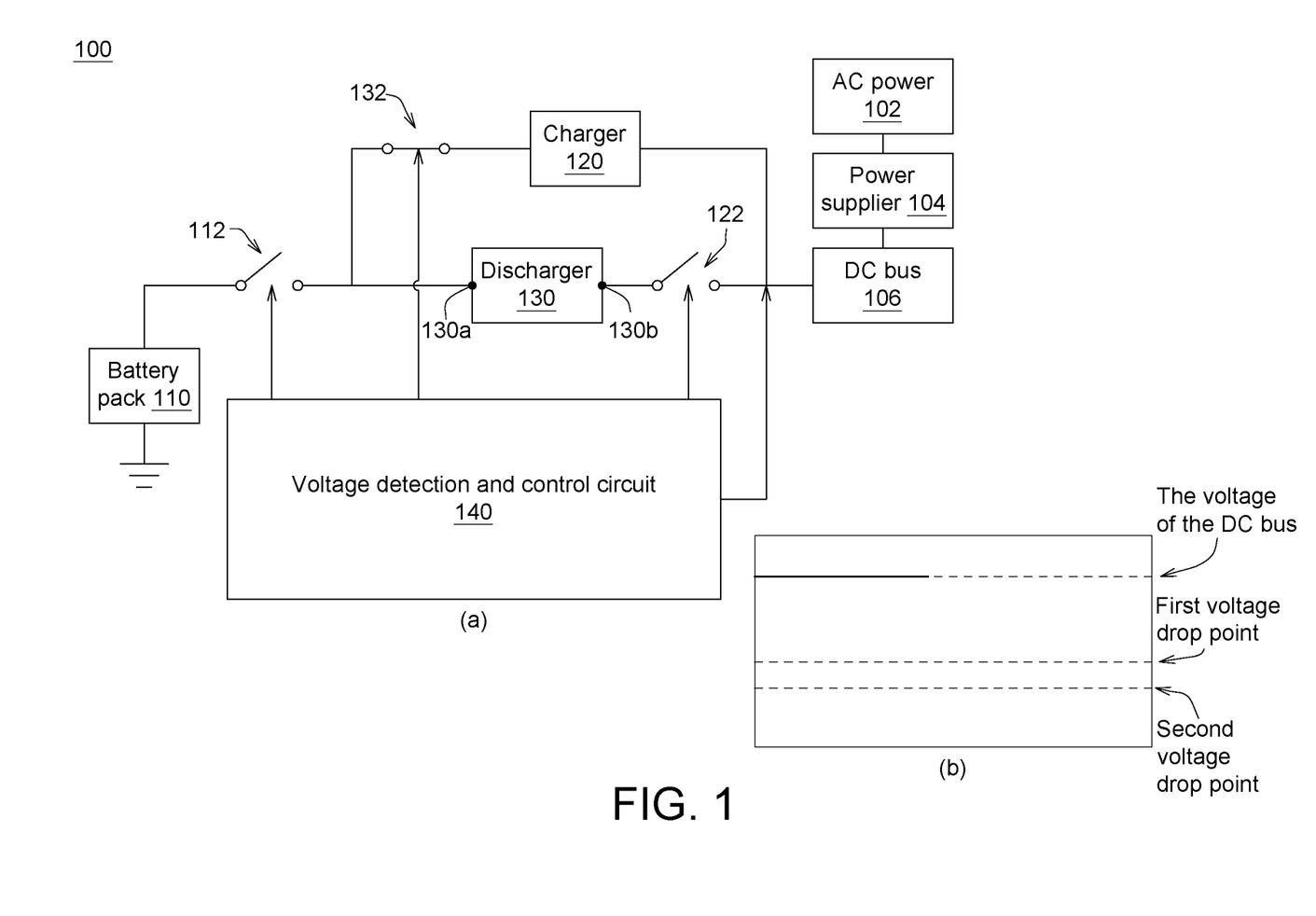
FIG. 1 is a schematic diagram respectively illustrates a battery backup system in a standby mode and the voltage of a DC bus thereof according to an embodiment of the present invention.

Refer to FIG. 1. When the voltage of the DC bus 106 is greater than the first voltage drop point, this indicates that the external power 102 supplies power normally, therefore the first protection switch 112 is turned off between the battery pack 110 and the discharger 130, the second protection switch 122 is turned off between the DC bus 106 and the discharger 130, the third protection switch 132 is turned on between the charger 120 and the input end 130a of the discharger 130, and the charger 120 is activated normally to provide power to the discharger 130. Meanwhile, the micro-processor 141 detects the voltages of the sensing end 143 and the output end 144 and controls the control logic 146 to output a low voltage level (such as 0) to turn off (terminate) the first protection switch 112.

Figure 2:
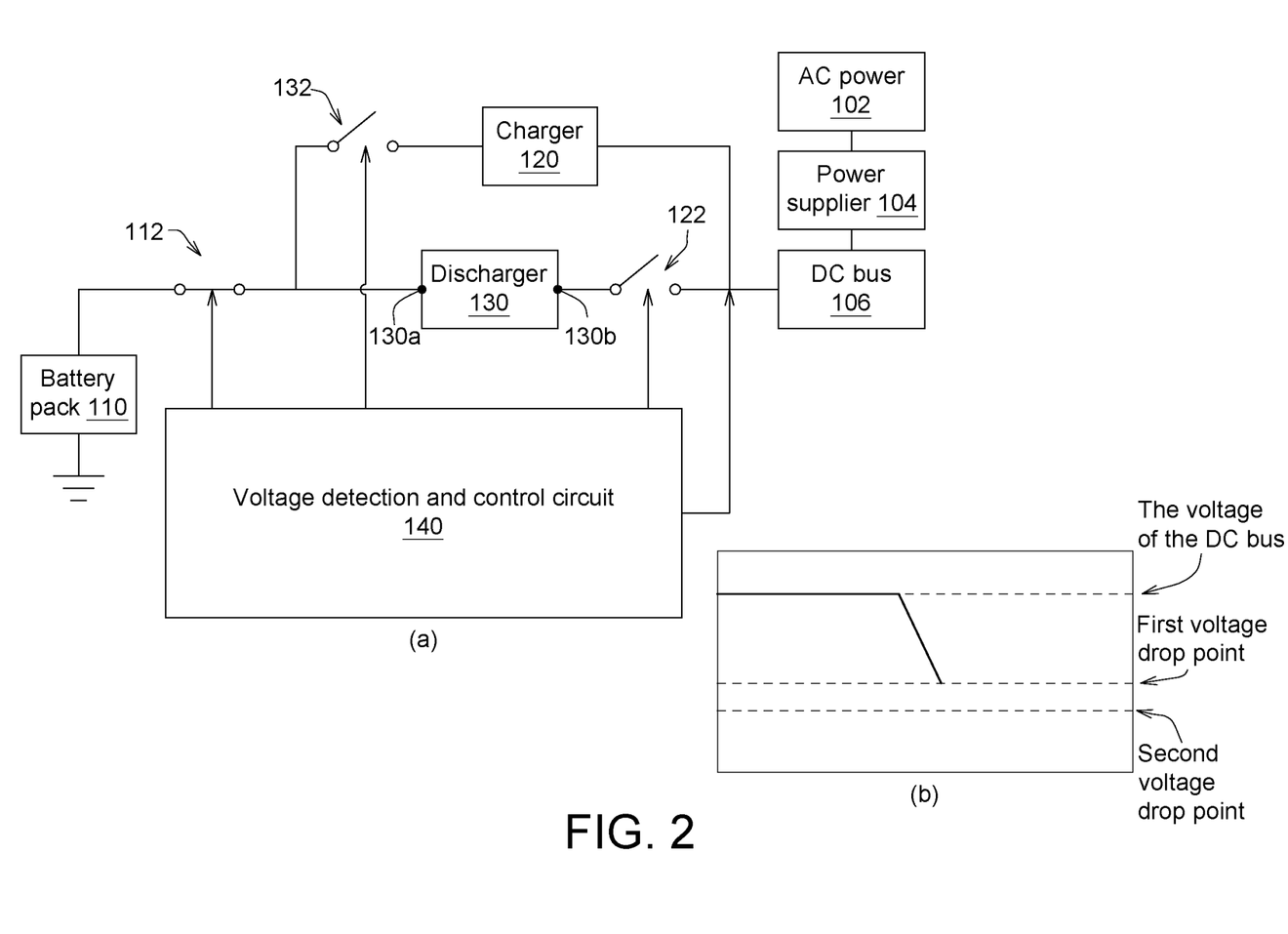
FIG. 2 is a schematic diagram respectively illustrates a battery backup system in a battery turned on mode and the voltage of a DC bus thereof according to an embodiment of the present invention.

Refer to FIG. 2. When the voltage of the DC bus 106 is less than or equal to the first voltage drop point, the first protection switch 112 is turned on between the battery pack 110 and the discharger 130, and the battery pack 110 provides power to the discharger 130. Meanwhile, the voltage of the DC bus 106 is still greater than the second voltage drop point, and the second protection switch 122 is turned off between the DC bus 106 and the discharger 130. Furthermore, since the external power 102 interrupts power supply, the charger 120 is turned off, and the third protection switch 132 is also turned off between the charger 120 and the input end 130a of the discharger 130. Meanwhile, the micro-processor 141 detects the voltages of the sensing end 143 and the output end 144 and controls the control logic 146 to output a high voltage level (such as 1) to turn on the first protection switch 112.

Figure 3:
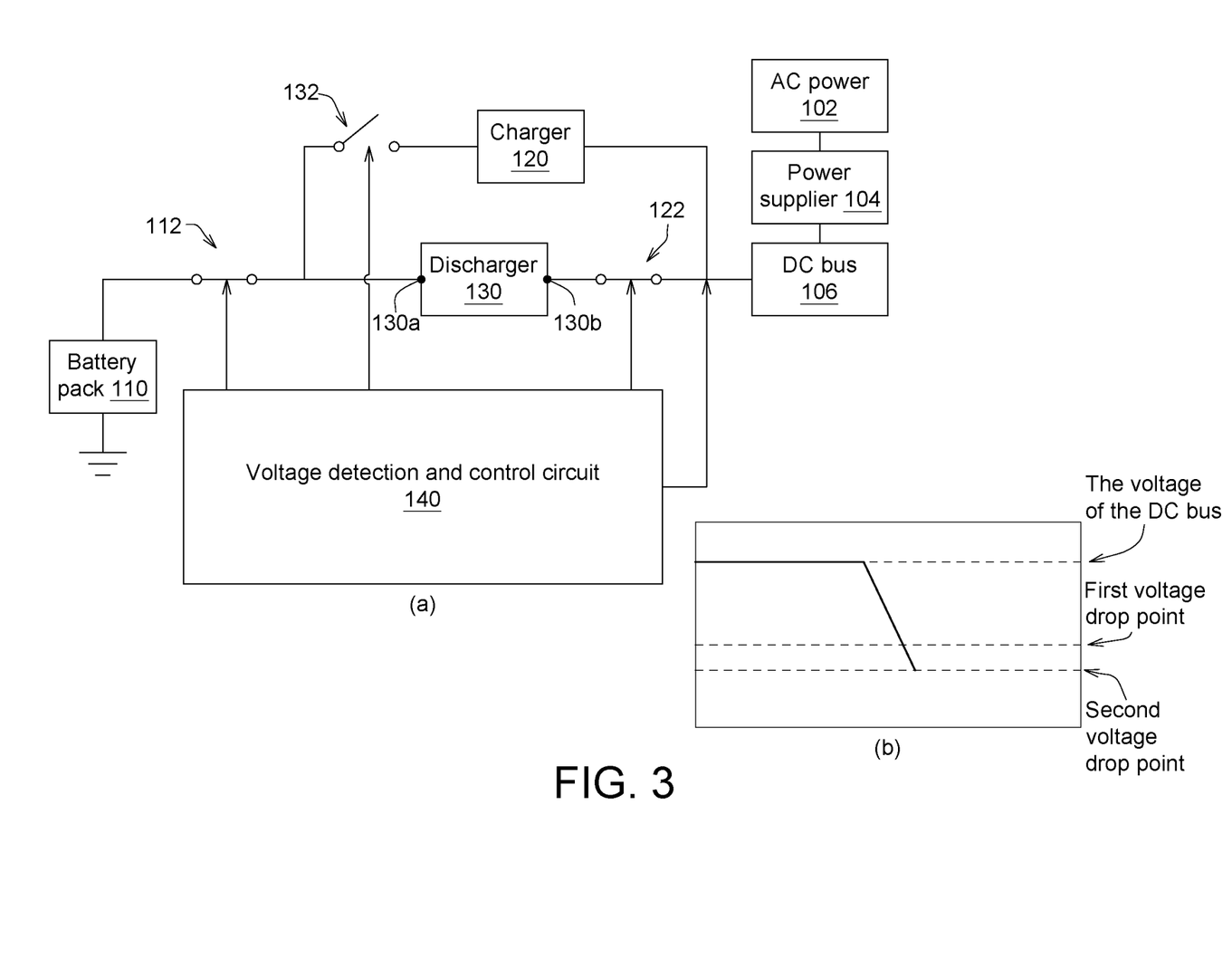
FIG. 3 is a schematic diagram respectively illustrates a battery backup system in a discharge mode and the voltage of a DC bus thereof according to an embodiment of the present invention.

Refer to FIG. 3. When the voltage of the DC bus 106 continuously drops to be less than or equal to the second voltage drop point, the second protection switch 122 is turned on between the DC bus 106 and the discharger 130, and the discharger 130 starts to provide the voltage of the DC bus 106.

Figure 4:
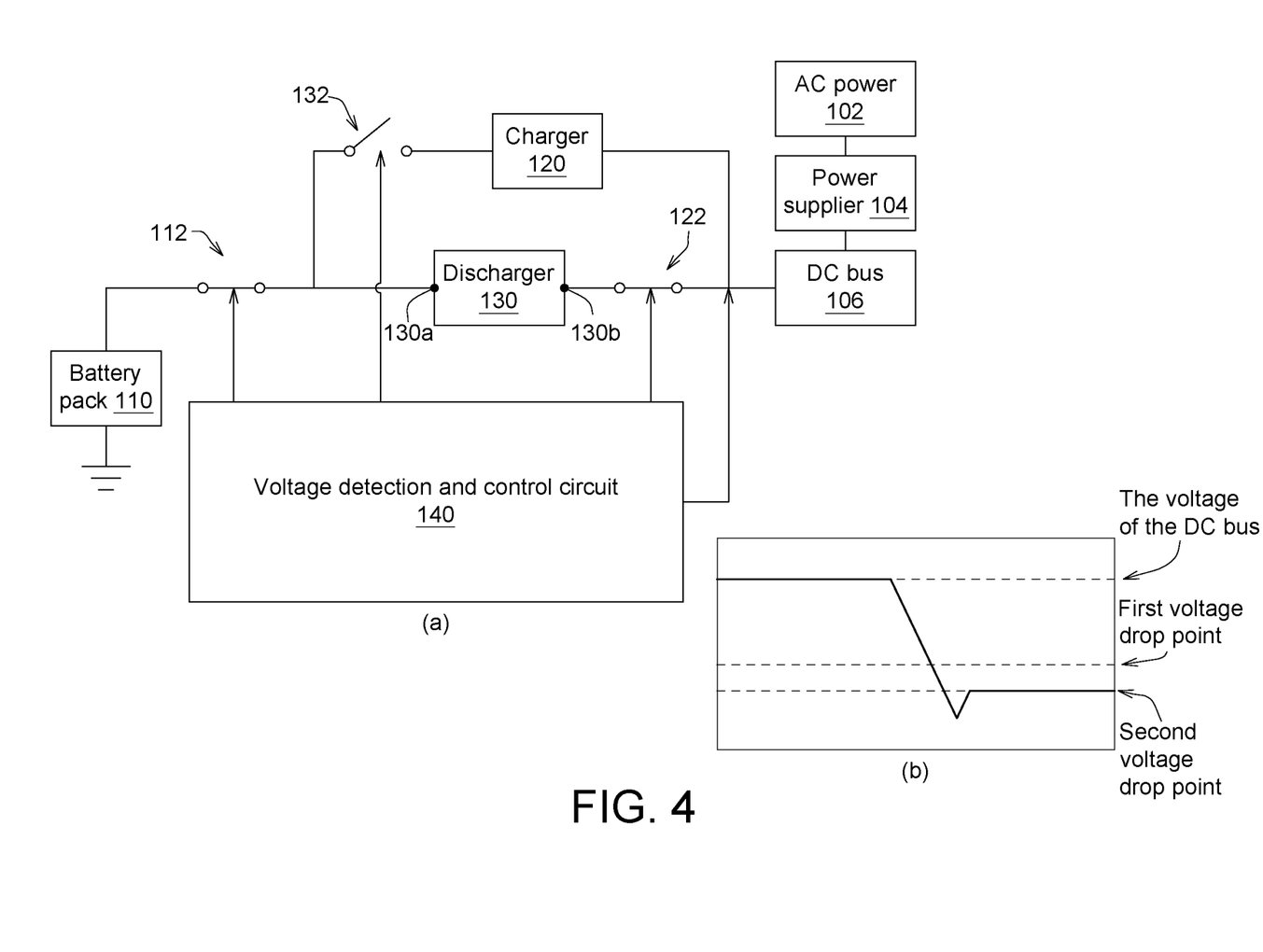
FIG. 4 is a schematic diagram respectively illustrates a battery backup system in a discharge mode and the voltage of a DC bus thereof according to an embodiment of the present invention.

Refer to FIG. 4. When the second protection switch 122 is turned on between the DC bus 106 and the discharger 130, the voltage detection and control circuit 140 continuously detects the voltage of the DC bus 106 and maintains the voltage of the DC bus 106 at the second voltage drop point until the external power 102 resumes power supply or until the capacity of the battery pack 110 runs out. That is, when the external power 102 interrupts power supply, the micro-processor 141 controls the control logic 146 to output a high voltage level to turn on the first protection switch 112 to use the backup power, and controls the control logic 146 to output a low voltage level to turn off (terminate) the third protection switch 132.

Figure 5:
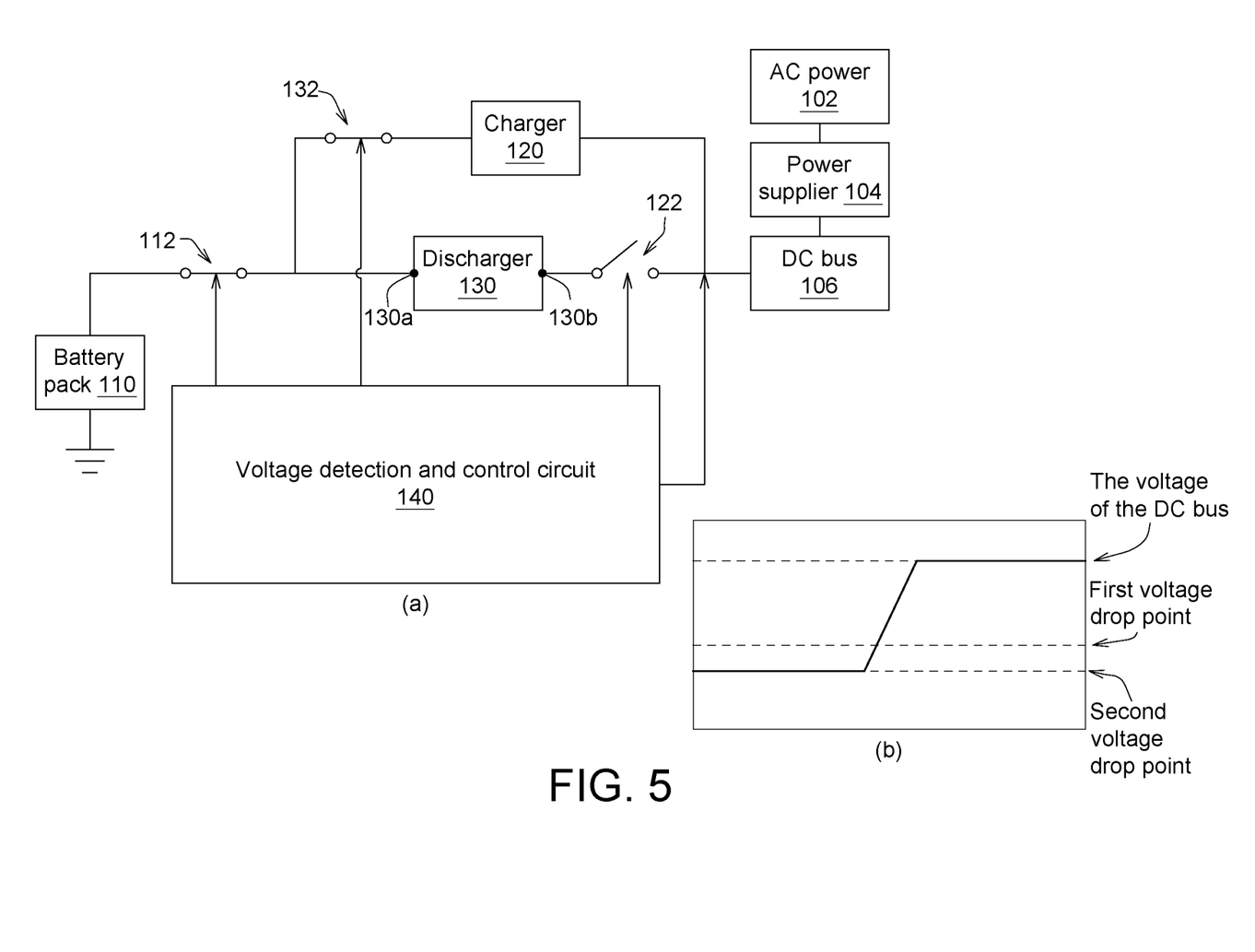
FIG. 5 is a schematic diagram respectively illustrates a battery backup system in a charge mode and the voltage of a DC bus thereof according to an embodiment of the present invention.

Refer to FIG. 5. When the external power 102 resumes power supply, the charger 120 is activated again, and the voltage of the DC bus 106 will be greater than the voltage of the output end 130*b* of the discharger 130. Meanwhile, the second protection switch 122 is turned off between the DC bus 106 and the discharger 130, the third protection switch 132 is turned on between the charger 120 and the input end 130*a* of the discharger 130, and the charger 120 starts to charge the battery pack 110. The charger 120 also provides power to maintain the discharger 130 at the activation mode. Meanwhile, the micro-processor 141 controls the control logic 146 to output a high voltage level to turn on the third protection switch 132 and the first protection switch 112 and enable the charger 120 to charge the battery pack 110.

The battery backup system and the voltage detection and control circuit disclosed in above embodiments of the present invention can be used in a data center or a service station. When the data center experiences interruption of AC power, the backup power can quickly provide power to the load to avoid the DC bus having a large voltage drop and causing a sudden shutdown. Meanwhile, the battery backup system sets a first voltage drop point and a second voltage drop point to prevent the false action of the battery pack, such that power consumption of the battery pack can be saved, the charging/discharging operations of the battery pack can be reduced, and the lifespan of the battery pack can be extended.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A battery backup system, comprising:
   a battery pack configured to provide a backup power to a DC bus;
   a charger connected to the battery pack to receive an external power;
   a discharger having an input end and an output end, wherein the input end is connected to the battery pack and the charger, and the output end is connected to the DC bus;
   a voltage detection and control circuit configured to detect whether the voltage of the DC bus is greater than a first voltage drop point or a second voltage drop point;
   a first protection switch connected between the battery pack and the input end of the discharger;
   a second protection switch connected between the DC bus and the output end of the discharger; and
   a third protection switch connected between the charger and the input end of the discharger,
   wherein, when the voltage of the DC bus is greater than the first voltage drop point, the first protection switch is turned off between the battery pack and the discharger; when the voltage of the DC bus is less than or equal to the first voltage drop point, the first protection switch is turned on between the battery pack and the discharger.

2. The battery backup system according to claim 1, wherein, when the voltage of the DC bus is greater than the second voltage drop point, the second protection switch is turned off between the DC bus and the discharger; when the voltage of the DC bus is less than or equal to the second voltage drop point, the second protection switch is turned on between the DC bus and the discharger, and the second voltage drop point is lower than the first voltage drop point.

3. The battery backup system according to claim 1, wherein the first voltage drop point is 95% of the voltage of the DC bus measured when the external power supplies power normally.

4. The battery backup system according to claim 1, wherein the second voltage drop point is less than the first voltage drop point from 0.2V to 0.3V.

5. The battery backup system according to claim 1, wherein, when the external power is continuous, the charger is activated, and the third protection switch is turned on between the charger and the input end of the discharger; when the external power is interrupted, the charger is turned off, and the third protection switch is turned off between the charger and the input end of the discharger.

6. The battery backup system according to claim 1, wherein, when the external power resumes after interruption, the charger is activated again, the third protection switch is turned on between the charger and the input end of the discharger, the second protection switch is turned off between the DC bus and the discharger, and the charger starts to charge the battery pack.

7. The battery backup system according to claim 1, wherein the voltage detection and control circuit comprises a micro-processor, a voltage detector and a control logic; the voltage detector is electrically connected to the DC bus and the control logic, and the micro-processor is electrically connected to the voltage detector and the control logic.

8. The battery backup system according to claim 7, wherein, when the voltage of the DC bus is greater than the first voltage drop point, the control logic outputs a low voltage level to the first protection switch; when the voltage of the DC bus is less than or equal to the first voltage drop point, the control logic outputs a high voltage level to the first protection switch.

9. The battery backup system according to claim 7, wherein, when the external power is continuous, the control logic outputs a low voltage level to the first protection switch and outputs a high voltage level to the third protection switch; when the external power is interrupted, the control logic outputs the high voltage level to the first protection switch and outputs the low voltage level to the third protection switch.

10. The battery backup system according to claim 7, wherein, when the external power resumes after interruption, the control logic outputs the high voltage level to the third protection switch and the first protection switch, and the charger charges the battery pack.

11. The battery backup system according to claim 1, wherein the first protection switch is an electronic fuse or a transistor switching element, the second protection switch is an O-ring field effect transistor, and the third protection switch is a transistor switching element.

\* \* \* \* \*